US009722043B2

(12) United States Patent
Basker et al.

(10) Patent No.: US 9,722,043 B2
(45) Date of Patent: Aug. 1, 2017

(54) SELF-ALIGNED TRENCH SILICIDE PROCESS FOR PREVENTING GATE CONTACT TO SILICIDE SHORTS

(71) Applicant: International Business Machines Corporation, Armonk, NY (US)

(72) Inventors: Veeraraghavan S. Basker, Schenectady, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 14/739,233

(22) Filed: Jun. 15, 2015

(65) Prior Publication Data

US 2016/0365424 A1    Dec. 15, 2016

(51) Int. Cl.
*H01L 29/66* (2006.01)
*H01L 21/8234* (2006.01)
*H01L 27/088* (2006.01)

(52) U.S. Cl.
CPC .... *H01L 29/665* (2013.01); *H01L 21/823418* (2013.01); *H01L 21/823431* (2013.01); *H01L 21/823468* (2013.01); *H01L 27/0886* (2013.01); *H01L 29/66545* (2013.01)

(58) Field of Classification Search
CPC ............. H01L 29/665; H01L 29/66545; H01L 21/823418; H01L 21/823431; H01L 21/823468; H01L 27/0886
USPC ........................................................ 257/384
See application file for complete search history.

(56) References Cited

U.S. PATENT DOCUMENTS

| 7,037,774 | B1 | 5/2006 | Syau |
| 7,087,471 | B2 | 8/2006 | Beintner |
| 7,554,165 | B2 | 6/2009 | Hokazono |
| 8,436,404 | B2 | 5/2013 | Bohr et al. |
| 8,679,968 | B2 | 3/2014 | Xie et al. |
| 8,716,124 | B2 | 5/2014 | Schultz |
| 8,728,927 | B1 | 5/2014 | Cheng et al. |
| 9,059,164 | B2* | 6/2015 | Cheng .................... H01L 29/511 |
| 9,064,725 | B2* | 6/2015 | Chen .................... H01L 29/6681 |
| 9,070,770 | B2* | 6/2015 | Basu ...................... H01L 29/785 |

(Continued)

OTHER PUBLICATIONS

U.S. Appl. No. 14/680,099, Cheng, filed Apr. 7, 2015.*

(Continued)

*Primary Examiner* — Victoria K Hall
(74) *Attorney, Agent, or Firm* — L. Jeffrey Kelly

(57) ABSTRACT

A method of forming a finFET device includes forming a plurality of fins on a substrate; forming a plurality of dummy gate structures over the plurality of fins, the dummy gate structures including gate sidewall spacers; performing an epitaxial growth process to merge the plurality of fins at locations not covered by the dummy gate structures; forming an interlevel dielectric (ILD) layer over the dummy gate structures and merged fins, the ILD layer comprising a first dielectric material; removing portions of the ILD layer and the merged fins so as to define trenches; and filling the trenches with a second dielectric material having an etch selectivity with respect to the first dielectric material, and wherein the gate sidewall spacers also comprise the second dielectric material such that regions of the merged fins in active areas are surrounded by the second dielectric material.

17 Claims, 9 Drawing Sheets

(56) References Cited

U.S. PATENT DOCUMENTS

| | | | |
|---|---|---|---|
| 9,190,519 B2* | 11/2015 | Lin | H01L 21/823431 |
| 9,219,153 B2* | 12/2015 | Xie | H01L 29/785 |
| 9,293,459 B1* | 3/2016 | Cheng | H01L 27/0886 |
| 9,337,313 B2* | 5/2016 | Leobandung | H01L 27/1211 |
| 9,418,994 B1* | 8/2016 | Chao | H01L 27/0886 |
| 9,443,853 B1* | 9/2016 | Cheng | H01L 27/0924 |
| 9,508,825 B1* | 11/2016 | Basker | H01L 29/665 |
| 9,564,367 B2* | 2/2017 | Jacob | H01L 21/823431 |
| 2006/0177979 A1* | 8/2006 | Tu | H01L 21/28079 438/243 |
| 2010/0320503 A1 | 12/2010 | Chong et al. | |
| 2010/0320509 A1 | 12/2010 | Knorr et al. | |
| 2012/0193712 A1* | 8/2012 | Bryant | H01L 29/41791 257/347 |
| 2012/0223394 A1* | 9/2012 | Toh | H01L 21/823475 257/384 |
| 2013/0320412 A1 | 12/2013 | Yamasaki | |
| 2014/0191296 A1* | 7/2014 | Bergendahl | H01L 29/7855 257/288 |
| 2014/0217517 A1 | 8/2014 | Cai et al. | |
| 2014/0264603 A1 | 9/2014 | He et al. | |
| 2014/0312397 A1* | 10/2014 | Cheng | H01L 21/283 257/288 |
| 2014/0339629 A1 | 11/2014 | Xie et al. | |
| 2015/0084134 A1* | 3/2015 | Lin | H01L 21/823431 257/384 |
| 2015/0129988 A1* | 5/2015 | Leobandung | H01L 29/785 257/410 |
| 2015/0200280 A1* | 7/2015 | Masuoka | H01L 29/66833 257/326 |
| 2015/0200291 A1* | 7/2015 | Alptekin | H01L 29/785 257/401 |
| 2015/0206955 A1* | 7/2015 | Kim | H01L 29/66795 438/285 |
| 2015/0325483 A1* | 11/2015 | Tran | H01L 28/20 438/382 |
| 2016/0141360 A1* | 5/2016 | Cheng | H01L 29/0673 257/347 |
| 2016/0172462 A1* | 6/2016 | Cheng | H01L 29/6681 257/192 |
| 2016/0315144 A1 | 10/2016 | Cheng et al. | |
| 2016/0358824 A1* | 12/2016 | Cheng | H01L 29/42376 |
| 2017/0076954 A1* | 3/2017 | Seo | H01L 21/30604 |

OTHER PUBLICATIONS

C. Auth, "22-nm Fully-Depleted Tri-Gate CMOS Transistors," IEEE Custom Integrated Circuits Conference (CICC), Sep. 9-12, 2012, pp. 1-6.

Disclosed Anonymously (IP.com), "Method and Structure to Prevent epi merge related shorts between devices for finfet technology," IP.com, IP000235784, Mar. 25, 2014, pp. 1-5.

List of IBM Patents or Patent Applications Treated as Related; Date Filed: Jun. 15, 2015, pp. 1-2.

U.S. Appl. No. 14/564,323, filed Dec. 9, 2014, entitled: "finFET With Wide Unmerged Source Drain EPI", 28 pages.

Pending U.S. Appl. No. 15/237,802, filed Aug. 16, 2016, entitled: "Minimizing Shorting Between finFET Epitaxial Regions", 24 pages.

IBM: List of IBM Patents or Patent Applications Treated as Related (Appendix P), Dec. 7, 2016 , 2 pages.

\* cited by examiner

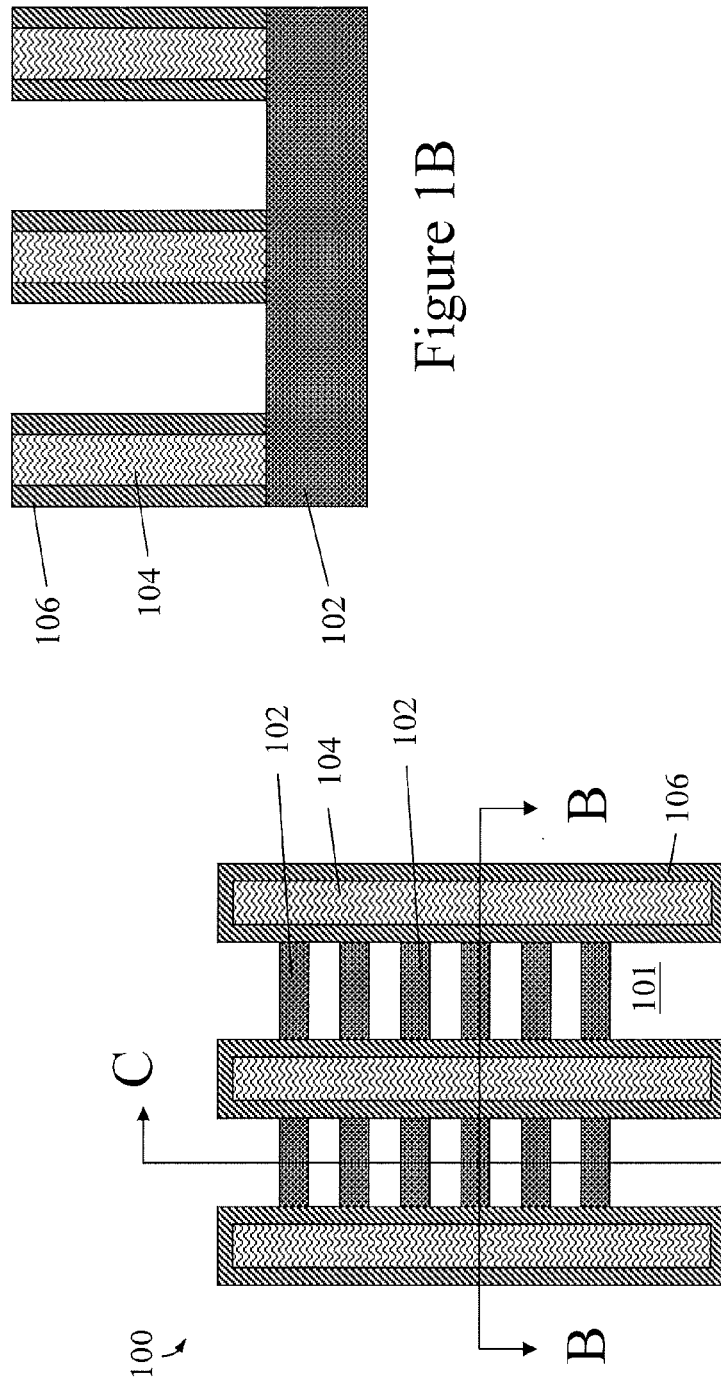

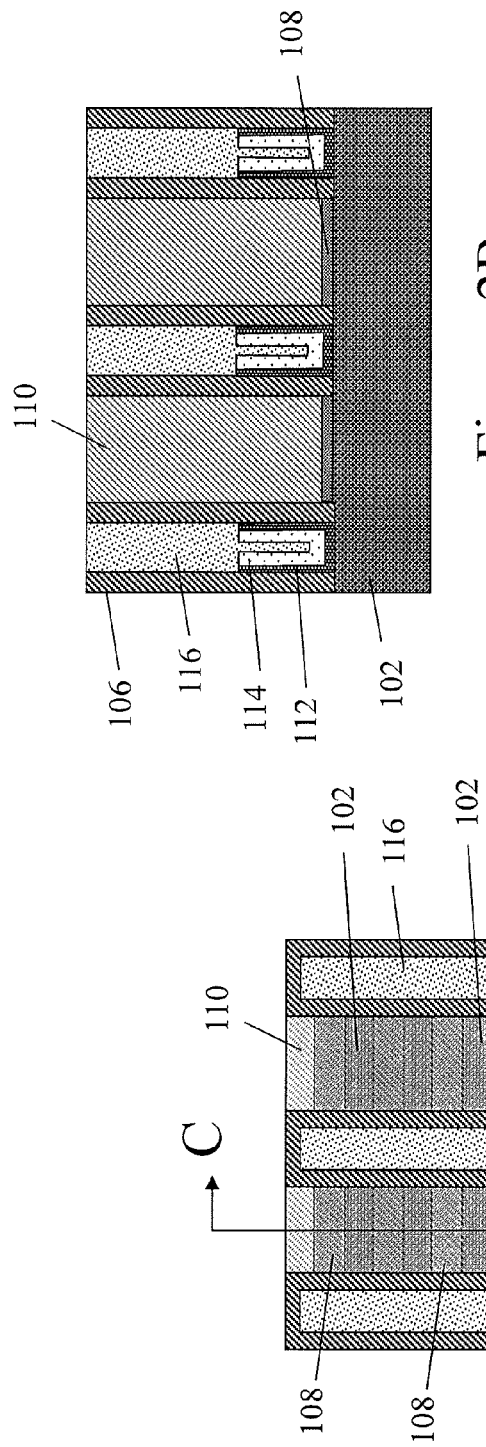
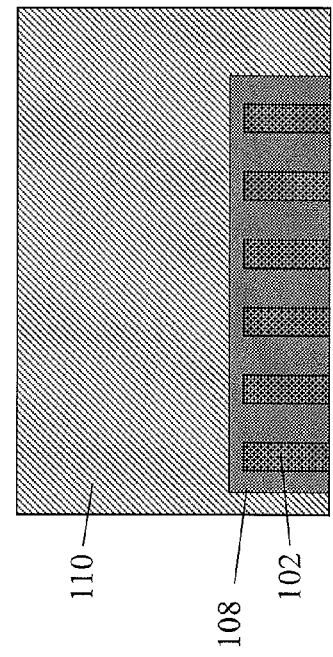
Figure 2B
Figure 2C
Figure 2A

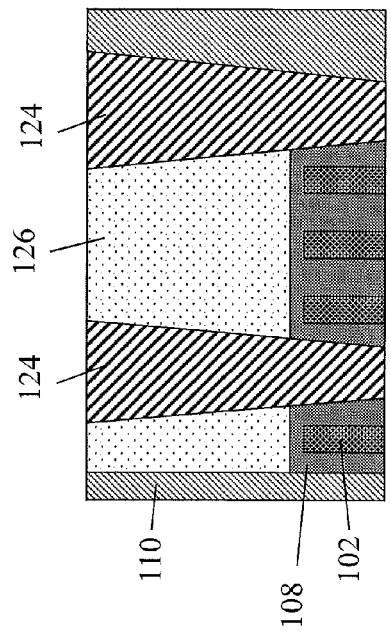
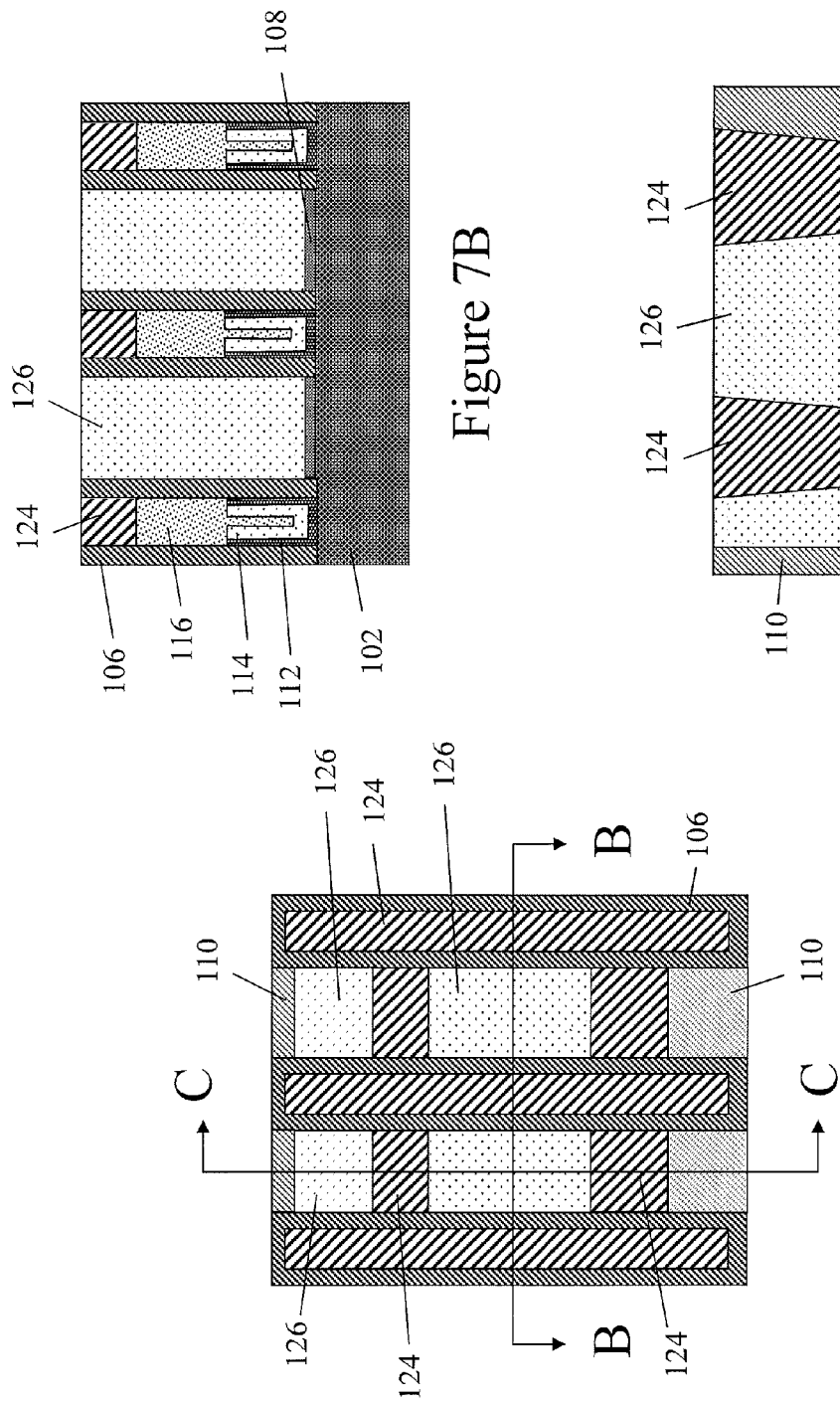
Figure 7B
Figure 7C
Figure 7A

SELF-ALIGNED TRENCH SILICIDE PROCESS FOR PREVENTING GATE CONTACT TO SILICIDE SHORTS

BACKGROUND

The present invention relates generally to semiconductor device manufacturing and, more particularly, to a self-aligned trench silicide process for preventing gate contact to silicide shorts.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques.

For example, when the gate length of conventional planar metal oxide semiconductor field effect transistors (MOSFETs) is scaled below 100 nm, problems associated with short channel effects (e.g., excessive leakage between the source and drain regions) become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent one type of structure that has been considered as a candidate for succeeding existing planar MOSFETs. In double-gate MOSFETs, two gates may be used to control short channel effects. A finFET is a double-gate structure that exhibits good short channel behavior, and includes a channel formed in a vertical fin. The finFET structure may be fabricated using layout and process techniques similar to those used for conventional planar MOSFETs.

SUMMARY

In one aspect, a method of forming a finFET device includes forming a plurality of fins on a substrate; forming a plurality of dummy gate structures over the plurality of fins, the dummy gate structures including gate sidewall spacers; performing an epitaxial growth process to merge the plurality of fins at locations not covered by the dummy gate structures; forming an interlevel dielectric (ILD) layer over the dummy gate structures and merged fins, the ILD layer comprising a first dielectric material; removing portions of the ILD layer and the merged fins so as to define trenches; and filling the trenches with a second dielectric material having an etch selectivity with respect to the first dielectric material, and wherein the gate sidewall spacers also comprise the second dielectric material such that regions of the merged fins in active areas are surrounded by the second dielectric material.

In another aspect, a method of forming a finFET device includes forming a plurality of fins on a substrate; forming a plurality of dummy gate structures over the plurality of fins, the dummy gate structures including nitride gate sidewall spacers; performing an epitaxial growth process to merge the plurality of fins at locations not covered by the dummy gate structures; forming an interlevel dielectric (ILD) layer over the dummy gate structures and merged fins, the ILD layer comprising an oxide; replacing the dummy gate structures with metal gate structures; removing portions of the ILD layer and the merged fins so as to define trenches; filling the trenches with a nitride material such that regions of the merged fins in active areas are surrounded by nitride walls; removing the ILD layer over the active areas bordered by the second dielectric material and forming a trench silicide on the active areas; forming an additional oxide ILD layer over the trench silicide; and etching the additional ILD layer to form source and drain (CA) contacts; wherein the etch selectivity of the nitride material with respect to oxide prevents a short circuit condition between a gate (CB) contact and the trench silicide.

In another aspect, a finFET device includes a plurality of fins formed on a substrate; a plurality of gate structures over the plurality of fins, the gate structures including gate sidewall spacers; an epitaxial layer formed over the plurality of fins that merges the plurality of fins at locations not covered by the gate structures; and an interlevel dielectric (ILD) layer formed over the dummy gate structures and merged fins, the ILD layer comprising a first dielectric material; wherein portions of the ILD layer and the merged fins are removed so as to define trenches, the trenches being filled with a second dielectric material having an etch selectivity with respect to the first dielectric material, and wherein the gate sidewall spacers also comprise the second dielectric material such that regions of the merged fins in active areas are surrounded by the second dielectric material.

BRIEF DESCRIPTION OF THE DRAWINGS

Referring to the exemplary drawings wherein like elements are numbered alike in the several Figures:

FIGS. 1A through 8C are a series of top and cross sectional views of a method of forming a finFET device using a self-aligned trench silicide process for preventing gate contact to silicide shorts, in accordance with an exemplary embodiment, in which:

FIG. 1A is a top view of a plurality of semiconductor fins and dummy gate structures formed over the fins;

FIG. 1B is a side cross sectional view taken along the arrows B-B of FIG. 1A;

FIG. 1C is a side cross sectional view taken along the arrows C-C of FIG. 1A;

FIG. 2A is a top view that illustrates source/drain epitaxial growth to merge the fins in active areas of the structure of FIG. 1A, along with interlevel dielectric layer (ILD) formation, dummy gate removal and replacement metal gate (RMG) deposition;

FIG. 2B is a side cross sectional view taken along the arrows B-B of FIG. 2A;

FIG. 2C is a side cross sectional view taken along the arrows C-C of FIG. 2A;

FIG. 7A is a top view that illustrates a trench silicide (TS) process in the active regions of the device of FIG. 6A;

FIG. 7B is a side cross sectional view taken along the arrows B-B of FIG. 7A;

FIG. 7C is a side cross sectional view taken along the arrows C-C of FIG. 7A;

FIG. 8C is a side cross sectional view taken along the arrows C-C of FIG. 8A;

DETAILED DESCRIPTION

Figures 3A, 3B, 3C:
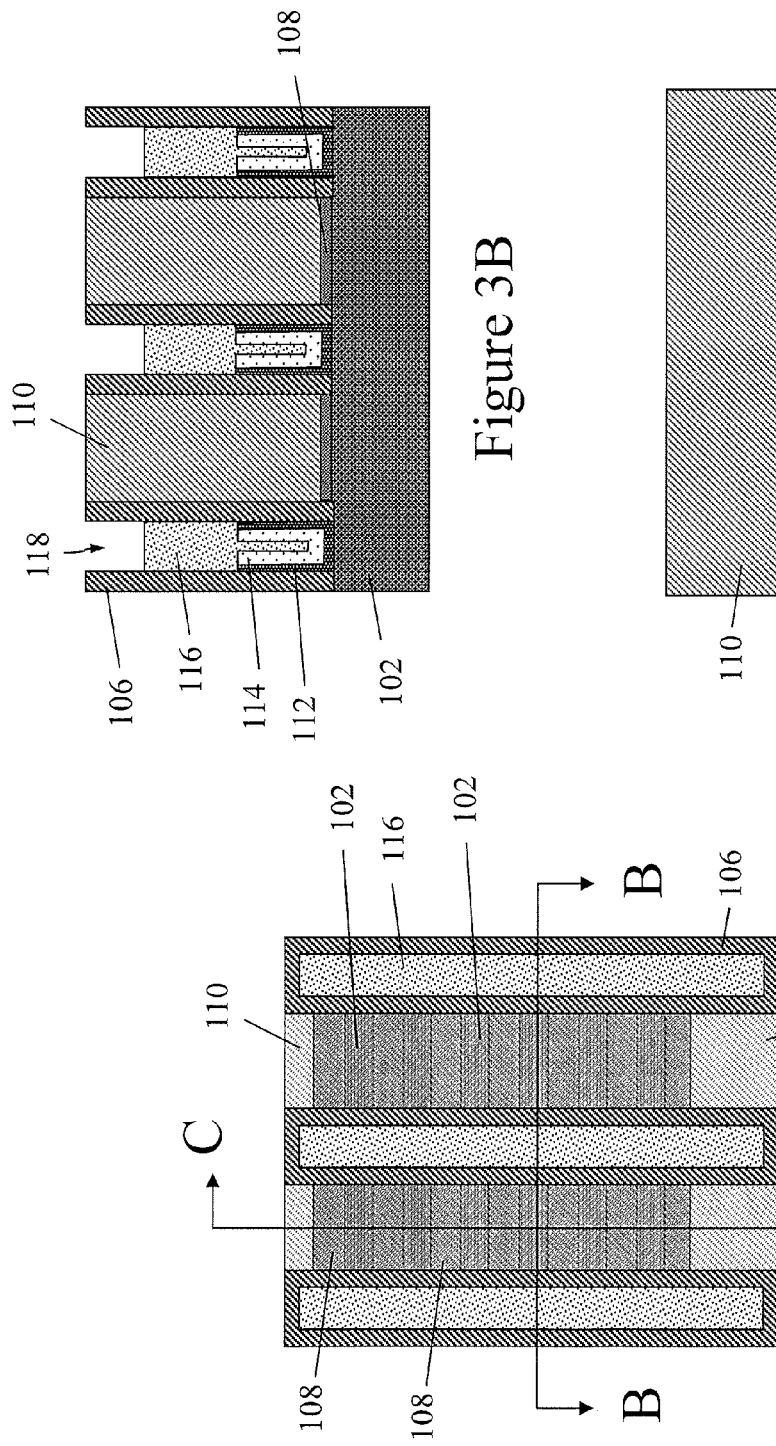
FIG. 3A a top view that illustrates recessing of the gate conductor metal, as best seen in FIG. 3B.
FIG. 3B is a side cross sectional view taken along the arrows B-B of FIG. 3A.
FIG. 3C is a side cross sectional view taken along the arrows C-C of FIG. 3A.

Tight ground rules (GR) pose severe challenges in designing and processing finFET devices at the 7 nanometer (nm) node and beyond. This is particularly the case for finFET processing, since conventional local contact level formation now requires multiple level patterning of structures such as the TS (trench silicide), CA (contact to source/drain), and CB (contact to gate). In particular, a CB to TS short has been identified a potential technology issue due to the tight ground rule requirement. Thus, there is a need for finFET processing method having reduced process challenges and improved the design margin.

Embodiments herein provide a method and structure for forming an improved finFET by defining the active device area (RX) after metal gate formation (RMG). Insulating walls are then formed around each RX simultaneously with the formation of the insulator cap on top of metal gate. The insulating walls (e.g., nitride have an etch selectivity with respect to an interlevel dielectric (ILD) layer, e.g., an oxide, which acts as an etch stop to prevent CB-to-TS shorts. In addition, undesired epi growth and dummy fins are removed during RX patterning to eliminate source/drain shorts.

Referring initially to FIGS. 1A-1C, a starting finFET structure 100 suitable for use in accordance with exemplary embodiments is illustrated. The starting finFET structure 100 may be formed on any suitable substrate 101, such as a silicon-on-insulator (SOI) substrate or a bulk semiconductor substrate. A plurality of semiconductor fins 102 is formed on the substrate 101 using any technique suitable in the art, including photoresist/hardmask patterning and etching, sidewall image transfer (SIT), and the like. As further shown in FIGS. 1A and 1B, a plurality of dummy gate structures 104 is formed over the fins 102, in a direction generally orthogonal to the fins 102. The dummy gate structures 104, which include a suitable dummy gate material such as polysilicon, for example, are surrounded by gate sidewall spacers 106, such as silicon nitride (SiN), silicon oxynitride (SiON), silicon oxycarbon nitride (SiOCN), silicon boron carbon nitride (SiBCN), silicon carbide (SiC) and silicon carbon nitride (SiCN). The formation of the starting finFET structure 100 is familiar to one skilled in the art of finFET and replacement metal gate (RMG) processes. At this point in conventional processing, dummy fins that are initially formed but not located in active areas may be removed by a suitable mask and etch process, however they will remain in place for a longer period in the present embodiments as discussed in further detail below.

Proceeding to FIGS. 2A-2C, multiple processing operations are illustrated. First, an epitaxial growth process is performed to merge the semiconductor material of the fins with an epitaxially grown layer or "epi" layer 108. To illustrate the relationship between the fins 102 and the epi layer 108, a different shading is used in the figures although it should be understood that the semiconductor material for both the fins 102 and the epi layer 108 may be the same (e.g., silicon). Next, an ILD layer 110 (e.g., oxide) is deposited over the structure and planarized to expose top surfaces of the dummy gate 104 and gate sidewall spacers 106. For ease of illustration, it will be noted that the ILD layer 110 shown in the top view FIG. 2A is shown as being semi-transparent with respect to the epi layer 108 below, and in turn the epi layer 108 is further semi-transparent with respect to the fins 102 below.

As further shown in FIGS. 2A and 2B, the dummy gate material 104 (from FIGS. 1A and 1B) is then removed and replaced with replacement metal gate (RMG) stack materials in a manner as known in the art. Such materials may include, but are not necessarily limited to, a high-k dielectric layer 112 formed from one or more of: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof where each value of x is independently from 0.5 to 3 and each value of y is independently from 0 to 2. The high-k dielectric layer 112 is followed by one or more workfunction metal layers 114, depending on the polarity of the device to be formed, such as TiN or TiC, for example. The high-k dielectric layer 112 and workfunction metal layer(s) 114 are then recessed as known in the art prior to deposition and planarization of a gate conductor metal 116 such as tungsten (W) for example. It will once again be noted that, as opposed to conventional processing, dummy fins have not yet been removed (cut) prior to RMG formation.

FIGS. 3A-3C illustrate the structure after a process to recess the gate conductor metal 116 from the uppermost portion of the gate stacks. This is best seen in FIG. 3B, which shows recesses 118 defined above the gate conductor metal 116.

Figure 4B:
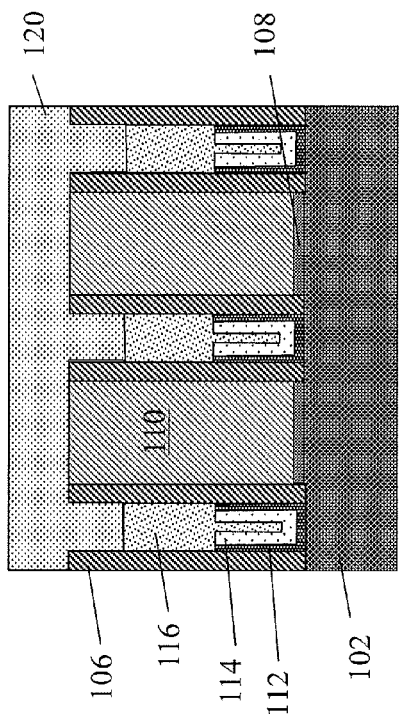
FIG. 4B is a side cross sectional view taken along the arrows B-B of FIG. 4A.
Figure 4C:
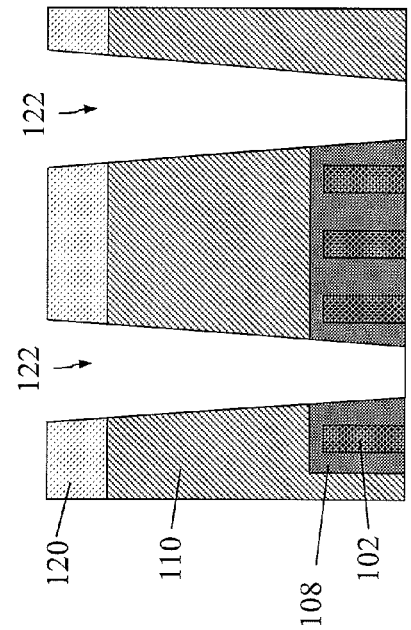
FIG. 4C is a side cross sectional view taken along the arrows C-C of FIG. 4A.
Figure 4A:
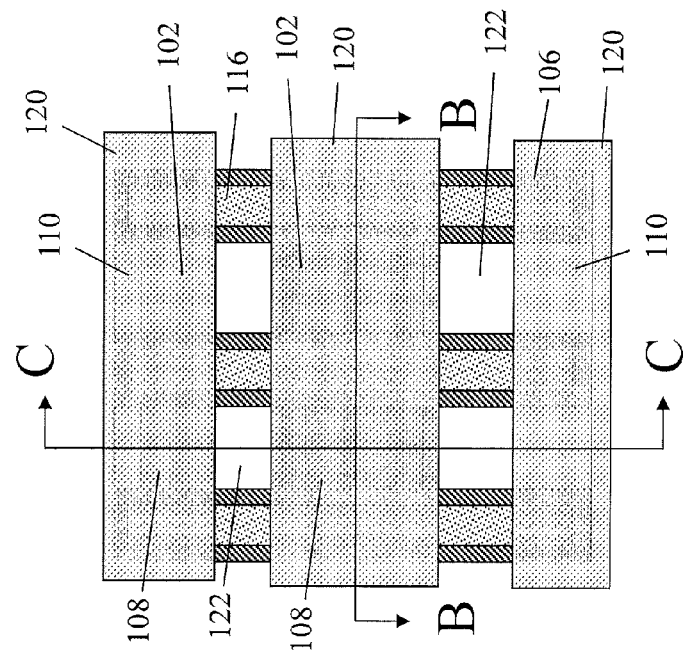
FIG. 4A is a top view that illustrates a fin cut mask process to remove dummy fins and a portion of the source/drain epitaxy material.
Figures 5A, 5B, 5C:
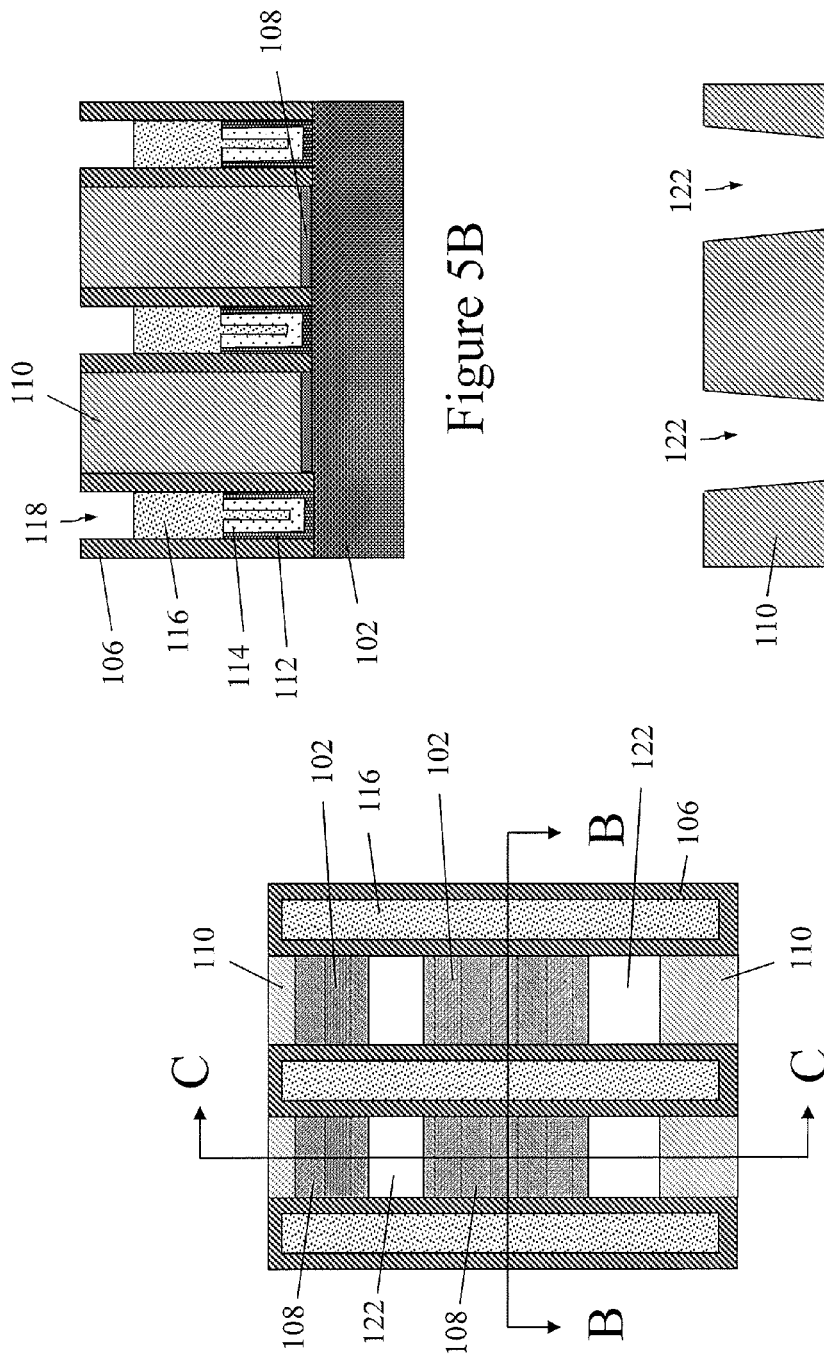
FIG. 5A is a top view that illustrates the removal of the mask from the structure of FIG. 4A.
FIG. 5B is a side cross sectional view taken along the arrows B-B of FIG. 5A.
FIG. 5C is a side cross sectional view taken along the arrows C-C of FIG. 5A.

Referring now to FIGS. 4A-4C, a masking process is performed to implement dummy fin removal, post RMG formation. A patterned hardmask layer 120 is opened to exposed regions of the device where merged dummy fins 102 and epi layer 108 are to be removed. This is followed by etching to remove both oxide ILD material 110 and semiconductor 102/108 material (using an etch chemistry selective to the oxide ILD material 110 and the semiconductor 102/108 material), thereby defining trenches 122. FIGS. 5A-5C illustrate the resulting post fin cut structure after removal of the mask 120.

Figures 6A, 6B, 6C:
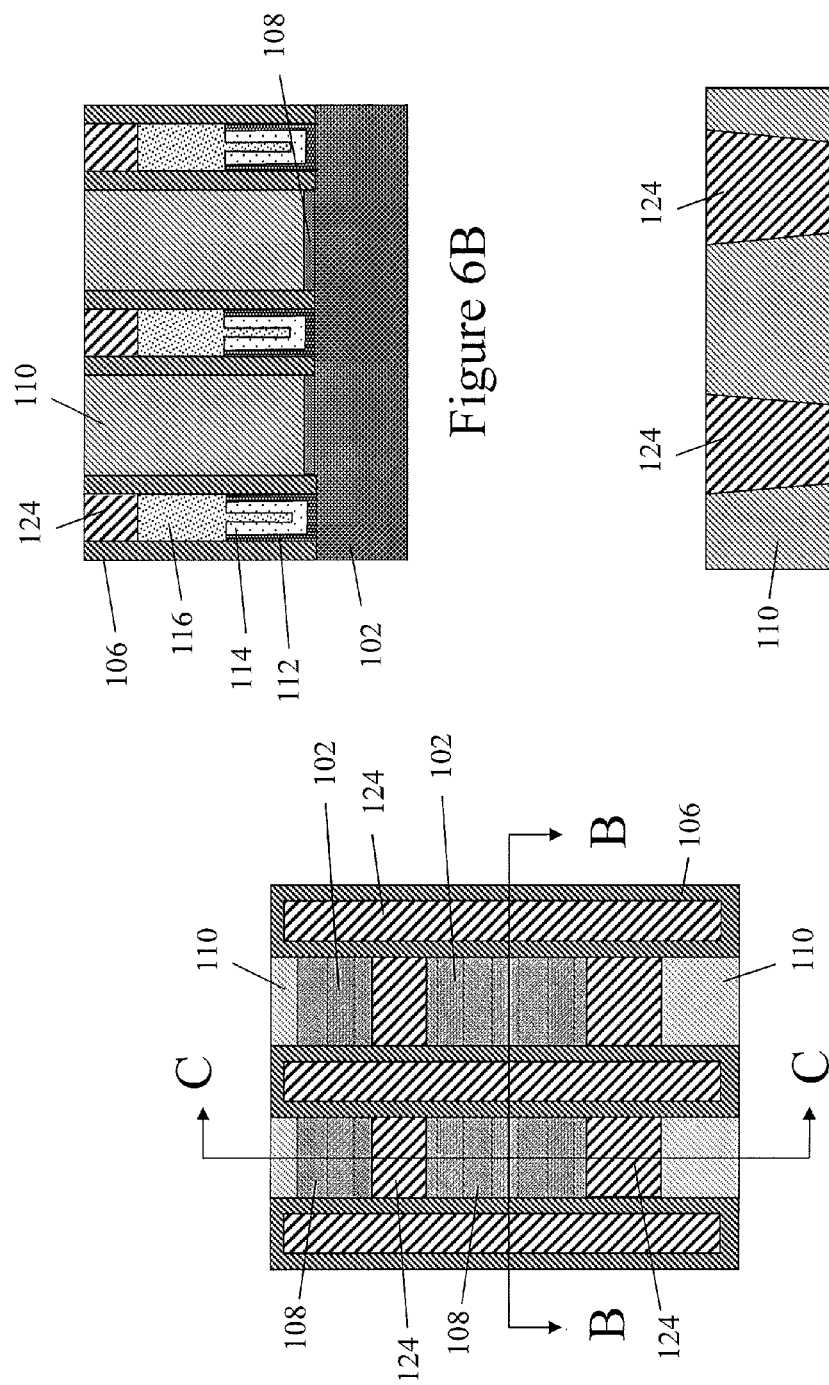
FIG. 6A is a top view that illustrates a nitride deposition process that fills the openings created by the gate metal recessing shown in FIG. 3B and the etching process shown in FIG. 4A and FIG. 4C.
FIG. 6B is a side cross sectional view taken along the arrows B-B of FIG. 6A.
FIG. 6C is a side cross sectional view taken along the arrows C-C of FIG. 6A.

As then shown in FIGS. 6A-6C, a dielectric deposition process is performed so as to form a dielectric layer 124 (e.g., nitride) within the open trenches 122, 118. The dielectric material can also be any one of the previously mentioned dielectrics such as silicon oxynitride (SiON), silicon oxycarbon nitride (SiOCN), silicon boron carbon nitride (SiBCN), silicon carbide (SiC) and silicon carbon nitride (SiCN). The dielectric layer 124 is then polished by chemical mechanical planarizing/polishing (CMP) operation to expose the ILD layer 110. Again in FIG. 6A, the oxide ILD layer 110 is depicted as being transparent over the active regions containing the merged fins 102/epi layer 108. As will also be noted from FIG. 6A, the active regions are now surrounded by nitride material on all four sides (i.e., by the original gate sidewall spacers 106 and the newly deposited nitride layer 124). This protection will ultimately prevent undesired shorts between adjacent TS areas. Further, as particularly shown in FIG. 6B, the portions of the dielectric layer 124 that replace recessed portions of the gate conductor metal 116 serve as a cap thereon.

Proceeding now to FIGS. 7A-7C, a trench silicide (TS) process is performed. The TS process includes patterning of a mask (not shown) to expose regions of the ILD layer 110 directly over the merged fins 102/epi layer 108 shown in FIGS. 6A-6C. This exposed portion of the ILD layer 110 is removed by etching and followed by deposition of a suitable silicide material 126 (e.g., Ti, TiN, W, etc.). The silicide process is also known in the art as a liner silicide. In the top view of FIG. 7A the active area having the merged fins 102/epi layer 108 is covered by the TS material 126, which is not transparent in this view.

Figure 8B:
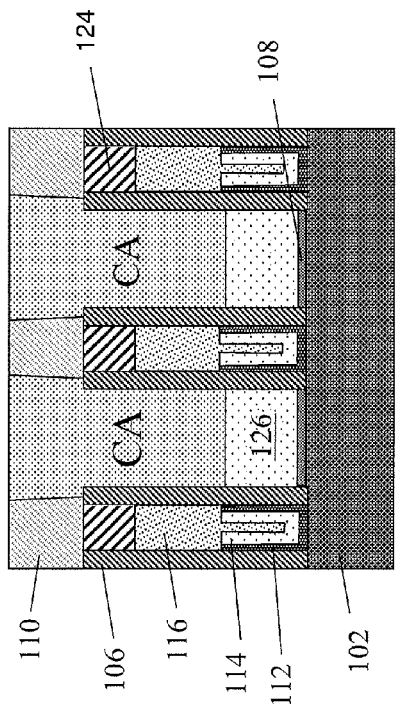
FIG. 8B is a side cross sectional view taken along the arrows B-B of FIG. 8A.
Figure 8C:
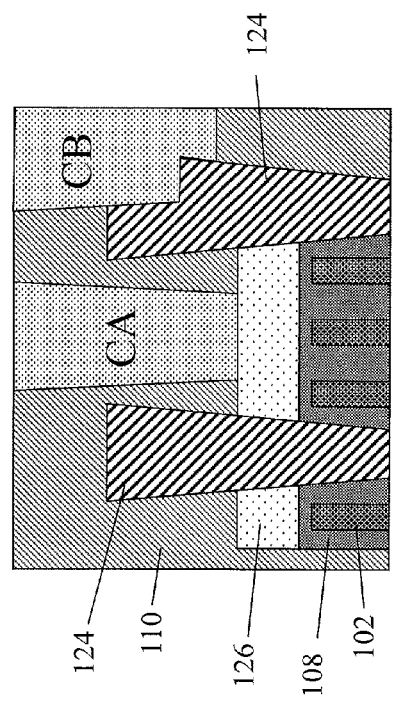
Figure 8A:
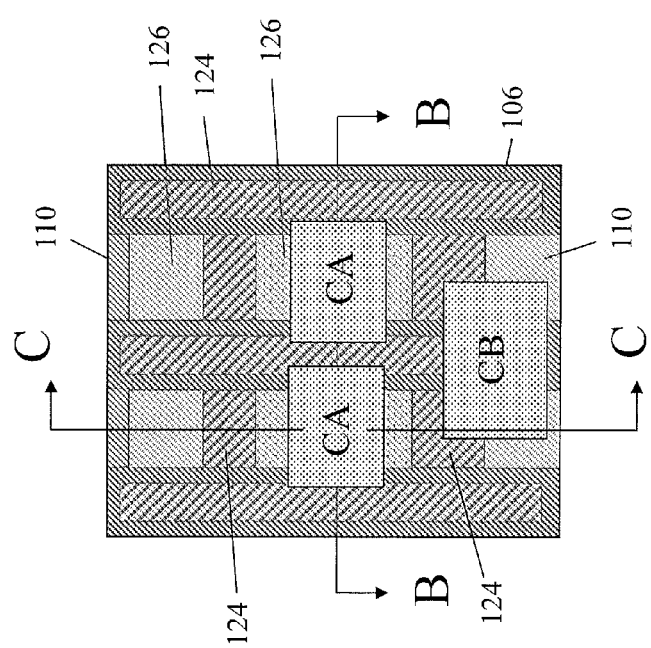
FIG. 8A is a top view that illustrates recessing of the trench silicide material, followed by additional source and drain contact ILD layer deposition, and the formation of source, drain and gate contacts.

FIG. 8A-8C illustrate the remaining operations in completing the formation of source/drain (CA) and gate (CB) contacts. The trench silicide material 126 is first recessed with an etch process selective to the TS metal, as best illustrated in FIGS. 8B and 8C. This is followed by deposition of additional oxide material 110 to define the gate/source/drain contact area ILD. Notably, the top view in FIG. 8A depicts the additional oxide ILD layer 110 as being semi-transparent in order to depict the underlying nitride and trench silicide structures. Then, following the additional ILD layer formation, the source/drain (CA) contacts and gate (CB) contacts are formed by ILD etching and contact metal (e.g., tungsten) deposition.

As indicated above, the tight ground rule requirement can potentially place the CB opening footprint in close proximity above a trench silicide region of the source/drain active areas of the finFET. By incorporating the dielectric insulator walls 124, the etch selectivity of the dielectric (e.g., nitride) material with respect to the ILD oxide material prevents substantial etching of the dielectric walls, thereby preventing a CB-to-TS short condition, as particularly illustrated in FIG. 8C. From this point, processing may continue as known in the art, including forming upper level wiring.

Figure 10:
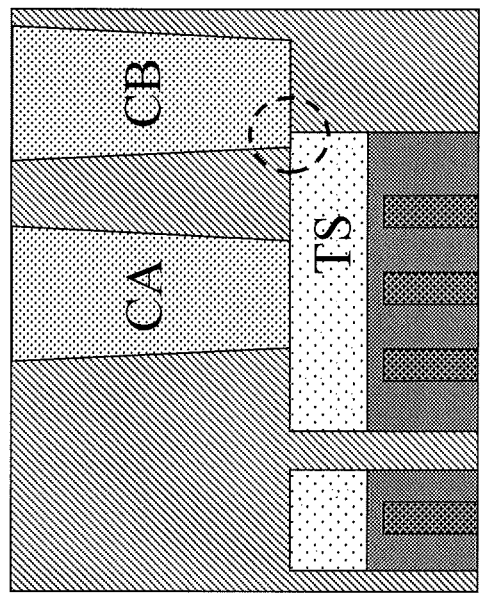
FIG. 10 is a side view for comparison with FIG. 9, illustrating the potential for gate contact to trench silicide shorting in a conventional process.
Figure 9:
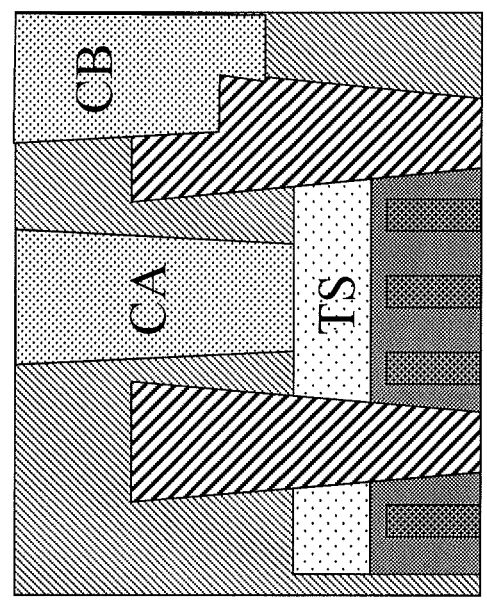
FIG. 9 is a duplicate view of FIG. 8C, which illustrates the use of the nitride wall material as an etch stop with respect to an oxide ILD layer to prevent gate contact to trench silicide shorting.

By way of comparison, reference may be made simultaneously to FIGS. 9 and 10. FIG. 9 is a reproduction of the view in FIG. 8C, and FIG. 10 represents a conventional finFET process that does not employ the above described dielectric wall formation. Without the dielectric material present, the oxide ILD etch process may result in the CB contact via reaching all the way to the TS material in the active areas of the finFET, thus causing a short as indicated by the dashed circle region in FIG. 10.

As will thus be appreciated, the combination of delaying dummy fin removal until after forming the RMG structures, and the fill of dielectric (e.g., nitride) within the trenches corresponding to removed dummy fin and epitaxial material allows for the prevention source/drain epi shorts through PC ends, as well as fin-to-fin shorting. The above described embodiments are suitable for use with both SOI and bulk finFETs, and it is contemplated that the processes are further extendable to nanowire technologies.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a finFET device, the method comprising:

forming a plurality of fins on a substrate;

forming a plurality of dummy gate structures over the plurality of fins, the dummy gate structures including gate sidewall spacers;

performing an epitaxial growth process to merge the plurality of fins at locations not covered by the dummy gate structures;

forming an interlevel dielectric (ILD) layer over the dummy gate structures and merged fins, the ILD layer comprising a first dielectric material;

removing portions of the ILD layer and portions of the merged fins selective to the dummy gate structures and gate sidewall spacers so as to define trenches on opposite sides of remaining portions of the merged fins, the remaining portions of the merged fins defining active areas of the substrate; and filling the trenches with a second dielectric material having an etch selectivity with respect to the first dielectric material, and wherein the gate sidewall spacers also comprise the second dielectric material, such that the active areas are surrounded on four sides by the second dielectric material in the trenches and the gate sidewall spacers.

2. The method of claim 1, wherein the first dielectric material comprises an oxide and the second dielectric material comprises a nitride material.

3. The method of claim 1, further comprising:
replacing the dummy gate structures with metal gate structures prior to removing portions of the ILD layer and the merged fins.

4. The method of claim 1, further comprising:
removing the ILD layer over the active areas bordered by the second dielectric material and forming a trench silicide on the active areas.

5. The method of claim 4, further comprising:
forming an additional ILD layer of the first dielectric material over the trench silicide; and
etching the additional ILD layer to form source and drain (CA) contacts and a gate (CB) contact;
wherein the etch selectivity of the second dielectric material prevents a short circuit condition between the gate (CB) contact and the trench silicide.

6. A method of forming a finFET device, the method comprising:
forming a plurality of fins on a substrate;
forming a plurality of dummy gate structures over the plurality of fins, the dummy gate structures including nitride gate sidewall spacers;
performing an epitaxial growth process to merge the plurality of fins at locations not covered by the dummy gate structures;
forming an interlevel dielectric (ILD) layer over the dummy gate structures and merged fins, the ILD layer comprising an oxide;
replacing the dummy gate structures with metal gate structures;
removing portions of the ILD layer and portions of the merged fins selective to the metal gate structures and nitride gate sidewall spacers so as to define trenches on opposite sides of remaining portions of the merged fins, the remaining portions of the merged fins defining active areas of the substrate;
filling the trenches with a nitride material such that the active areas are surrounded on four sides by the nitride material in the trenches and the nitride gate sidewall spacers;
removing the ILD layer over the active areas bordered by the nitride material and forming a trench silicide on the active areas;
forming an additional oxide ILD layer over the trench silicide; and
etching the additional oxide ILD layer to form source and drain (CA) contacts and a gate (CB) contact;
wherein the etch selectivity of the nitride material with respect to oxide prevents a short circuit condition between the gate (CB) contact and the trench silicide.

7. The method of claim 6, wherein replacing the dummy gate structures with metal gate structures comprises:
removing a dummy gate fill material, forming a high-k dielectric layer, one or more workfunction metal layers and a gate conductor metal.

8. The method of claim 7, further comprising:
recessing a portion of the gate conductor metal prior to filling the trenches with the nitride material.

9. The method of claim 8, wherein a portion of the nitride material replaces the recessed portion of the gate conductor metal so as to form a cap on the gate conductor metal.

10. The method of claim 6, further comprising:
recessing a portion of the trench silicide prior to forming the additional oxide ILD layer.

11. A finFET device, comprising:
a plurality of fins on a substrate;
a plurality of gate structures over the plurality of fins, the gate structures including gate sidewall spacers;
an epitaxial layer over the plurality of fins that merges the plurality of fins at locations not covered by the gate structures; and
an interlevel dielectric (ILD) layer over the gate structures and merged fins, the ILD layer comprising a first dielectric material;
a plurality of dielectric studs located between the plurality of gate structures extending vertically from the substrate to an upper surface of the ILD layer, wherein both the plurality of dielectric studs and the gate sidewall spacers comprise a second dielectric material having an etch selectivity with respect to the first dielectric material, such that regions of the merged fins in active areas are surrounded by the second dielectric material.

12. The device of claim 11, wherein the first dielectric material comprises an oxide and the second dielectric material comprises a nitride material.

13. The device of claim 11, wherein the gate structures comprise metal gate structures.

14. The device of claim 13, wherein the metal gate structures comprise a high-k dielectric layer, one or more workfunction metal layers and a gate conductor metal.

15. The device of claim 11, further comprising:
a trench silicide on the merged fins.

16. The device of claim 11, further comprising:
an additional oxide ILD layer formed over a trench silicide on the merged fins; and
source and drain (CA) contacts formed in etched areas of the additional ILD layer;
wherein the etch selectivity of the nitride material with respect to oxide prevents a short circuit condition between a gate (CB) contact and the trench silicide.

17. The device of claim 11, wherein metal gate structures of the gate structures are recessed below the gate sidewall spacers and a portion of the second dielectric material forms a cap on top of the gate structures between the gate sidewall spacers.

* * * * *